US 6,645,879 B2

(12) United States Patent
Hong et al.

(10) Patent No.: US 6,645,879 B2
(45) Date of Patent: Nov. 11, 2003

(54) METHOD OF FORMING A SILICON OXIDE LAYER OF A SEMICONDUCTOR DEVICE AND METHOD OF FORMING A WIRING HAVING THE SAME

(75) Inventors: Eun-Kee Hong, Suwon-si (KR); Ju-Bum Lee, Yongin-si (KR); Ju-Seon Goo, Suwon-si (KR); Myeong-Cheol Kim, Suwon-si (KR); Hong-Gun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/215,309

(22) Filed: Aug. 8, 2002

(65) Prior Publication Data

US 2003/0036291 A1 Feb. 20, 2003

(30) Foreign Application Priority Data

Aug. 18, 2001 (KR) ...................... 2001-0049779

(51) Int. Cl.$^7$ .................. H01L 21/31; H01L 21/469
(52) U.S. Cl. .................. 438/778; 438/787; 438/935
(58) Field of Search .................. 438/436, 438, 438/760, 761, 762, 787, 935

(56) References Cited

U.S. PATENT DOCUMENTS 5,879,986 A    3/1999   Sung .................. 438/253
6,225,236 B1 * 5/2001   Nishimoto et al.

* cited by examiner

Primary Examiner—Phuc T. Dang
(74) Attorney, Agent, or Firm—Mills & Onello LLP

(57) ABSTRACT

Disclosed are methods for forming a silicon oxide layer of a semiconductor device capable of insulating between fine conductive patterns without causing a process failure, and for forming a wiring having the silicon oxide layer. After forming conductive patterns on a semiconductor substrate, an anti-oxidation layer is sequentially formed on the conductive patterns and on the semiconductor substrate. The anti-oxidation layer prevents an oxidant from penetrating into the conductive patterns and the semiconductor substrate. A reflowable oxide layer is formed by coating a reflowable oxidizing material on the anti-oxidation layer while burying the conductive patterns. The silicon oxide layer is formed by thermally treating the reflowable oxide layer. Then, the silicon oxide layer filled between conductive patterns and the anti-oxidation layer exposed to the semiconductor substrate are etched so as to form a contact hole, thereby forming the wiring of the semiconductor device. Thus, a planar silicon oxide layer is formed between conductive patterns having a fine interval therebetween without creating a void. In addition, a metal layer pattern, which acts as a conductor in the conductive patterns, can be prevented from being oxidized when the silicon oxide layer is formed.

26 Claims, 15 Drawing Sheets

METHOD OF FORMING A SILICON OXIDE LAYER OF A SEMICONDUCTOR DEVICE AND METHOD OF FORMING A WIRING HAVING THE SAME

BACKGROUND OF THE INVENTION

1. Field of the Invention

The present invention relates to a method of forming a silicon oxide layer of a semiconductor device and a method of forming a wiring having the same, and more particularly to a method of forming a silicon oxide layer capable of insulating between patterns without oxidizing other layers and a method of forming a wiring having the silicon oxide layer.

2. Description of the Related Art

As semiconductor devices are highly integrated with high processing speed, it is required to form fine patterns. In this regard, widths of patterns as well as space between patterns are remarkably reduced. Accordingly, it becomes very difficult to fill a silicon oxide layer into a narrow space between patterns for insulating between patterns.

A PE-CVD process, which is generally used for forming layers of a semiconductor device, cannot completely insulate patterns having a narrow space therebetween. For this reason, a method for forming the silicon oxide layer by using an SOG layer or a BPSG layer having a superior gap fill characteristic is suggested.

FIGS. 1A to 1D are sectional views showing a conventional method of forming a silicon oxide layer for insulating fine patterns from each other.

Referring to FIG. 1A, an insulating layer 14 including a plurality of first conductive patterns 12 therein is formed on a semiconductor substrate 10. Particularly, after forming a conductive layer on the semiconductor substrate 10 or the semiconductor substrate 10 having a predetermined layer formed thereon, the conductive layer is patterned so as to form the plurality of first conductive patterns 12. Then, the insulating layer 14 is formed to bury the first conductive patterns 12.

Thereafter, second conductive patterns 16 are formed on the insulating layer 14. At this time, the second conductive patterns 16 are located at positions above the corresponding portions between the first conductive patterns 12. The second conductive pattern 16 is a composite pattern including a metal layer pattern 16a and a nitride layer pattern 16b that is sequentially formed on the metal layer pattern 16a. The nitride layer pattern 16b is formed by patterning a nitride layer after forming a nitride layer using a PE-CVD process.

Referring to FIG. 1B, a nitride layer spacer 18 is formed at sidewalls of the second conductive pattern 16. The nitride layer spacer 18 is used for forming a self-aligned contact hole through subsequent processes. The self-aligned contact hole is conductively communicated with lower first conductive patterns 12.

In detail, the nitride layer is sequentially formed on the sidewalls and upper portions of the second conductive layer patterns 16 and an upper surface of the insulating layer 14. The nitride layer is formed through an LP-CVD process. Then, the nitride layer is anisotropically etched such that the nitride layer remains only on the sidewalls of the second conductive patterns 16, thereby forming the nitride layer spacer 18.

Referring to FIG. 1C, a reflowable oxide layer 20 is formed so as to bury spaces between second conductive patterns 16 formed with the nitride layer spacer 18 and the second conductive patterns 16. The reflowable oxide layer 20 is formed as an SOG layer or a BPSG layer.

Referring to FIG. 1D, a silicon oxide layer 22 is formed by heat-treating the reflowable oxide layer 20.

That is, if the SOG layer is heat-treated in an oxygen atmosphere, Si—N or Si—H bond is replaced with Si—O bond so the silicon oxide layer 22 is formed. In addition, the BPSG layer is formed as a planar layer 38 through a reflow process, in which the BPSG layer is heat-treated in the oxygen atmosphere, while burying the second conductive patterns 16 and the spaces between second conductive patterns 16.

At this time, oxygen used for heat-treating the SOG layer or the BPSG layer penetrates into the second conductive patterns 16. That is, oxygen penetrates into a pin hole of a nitride layer pattern 16b of the second conductive layer pattern 16 and an interfacial surface of the nitride layer spacer 18, so the metal layer pattern 16a of the second conductive layer pattern 16 is oxidized.

Particularly, since the nitride layer pattern 16b of the second conductive layer pattern 16 is formed through the PE-CVD process, the nitride layer pattern 16b is roughly formed so the pin holes may be formed in the nitride layer pattern 16b, so that the metal layer pattern 16 is frequently oxidized.

When the metal layer pattern 16a is oxidized, a volume of the metal layer pattern is enlarged, so that the metal layer pattern is upwardly lifted caused by the enlarged volume thereof which is called "a metal lifting failure". In addition, the lifting of the metal layer pattern causes a crack to the silicon oxide layer. If the second conductive layer pattern is formed in a conductive line type, the conductive line can be disconnected caused by the lifting of the meal layer pattern, thereby causing a failure of the semiconductor device.

U.S. Pat. No. 5,879,986 discloses a method of forming a silicon oxide layer for insulating between fine patterns and of forming a wiring. According to the above patent, a nitride layer is formed on a conductive layer pattern through a PE-CVD process. Then, an oxide layer is formed while burying a space between the conductive layer and an insulating layer. The oxide layer is formed through the PE-CVD process. However, if a fine space is formed between conductive layer patterns, forming the oxide layer insulating between the conductive layer patterns via the PE-CVD is difficult.

Recently, a method for forming an insulating layer through an HDP (high density plasma) CVD process is suggested for forming the insulating layer between fine conductive layer patterns. However, the HDP CVD process also has a limitation for forming the insulating layer between the fine conductive layer patterns.

SUMMARY OF THE INVENTION

The present invention has been made to solve the above problems of the prior art, therefore, it is a first object of the present invention to provide a method for forming a silicon oxide layer of a semiconductor device capable of insulating between fine conductive layer patterns without causing a process failure.

The second object of the present invention is to provide a method for forming a wiring of a semiconductor device having a silicon oxide layer capable of insulating between fine conductive layer patterns without causing a failure.

In accordance with an aspect of the present invention, a method of forming an insulating layer in a semiconductor device is provided. In accordance with the method, a plurality of conductive patterns are formed on a semiconductor substrate. An anti-oxidation layer is sequentially formed on the conductive patterns and on the semiconductor substrate for preventing an oxidant from penetrating into the conductive patterns and the semiconductor substrate. A reflowable oxide layer is formed by coating reflowable oxidizing materials on the conductive patterns formed with the anti-oxidation layer while burying the conductive patterns. A silicon oxide layer is formed by thermally treating the reflowable oxide layer.

In accordance with a second aspect of the present invention, a method of forming a wiring in a semiconductor device is provided. In accordance with the method, an insulating layer including a plurality of first conductive patterns therein is formed on a semiconductor substrate. Second conductive patterns are formed on portions of the insulating layer corresponding to spaces formed between first conductive patterns. An anti-oxidation layer is sequentially formed on upper surfaces of the second conductive patterns and the insulating layer for preventing an oxidant from penetrating into the second conductive patterns and the insulating layer. A reflowable oxide layer is formed by coating a reflowable oxide on the anti-oxidation layer while burying the second conductive patterns. A silicon oxide layer is formed by thermally treating the reflowable oxide layer. A preliminary contact hole is formed for exposing the anti-oxidation layer formed on the insulating layer by anisotropically etching a predetermined portion of the silicon oxide layer. The anti-oxidation layer exposed to the upper surface of the insulating layer and the insulating layer are anisotropically etched, in sequence, thereby forming a contact hole for exposing an upper surface of the first conductive patterns. A conductive material is filled in the contact hole, thereby completing a wiring of a semiconductor device.

In accordance with another aspect of the present invention, a method of forming a wiring in a semiconductor device is provided. In accordance with the method, an insulating layer including a plurality of first conductive patterns therein is formed on a semiconductor substrate. Second conductive patterns are formed on portions of the insulating layer corresponding to spaces formed between first conductive patterns. A nitride layer spacer is formed at sidewalls of the second conductive patterns. A first preliminary contact hole is formed for exposing an upper surface of the first conductive patterns by performing an anisotropic etching process using the nitride layer spacer as an etching mask. An anti-oxidation layer is sequentially formed on an upper surface of the second conductive pattern, an upper surface of the insulating layer, and a sidewall and a bottom surface of the first preliminary contact hole, for preventing an oxidant from penetrating thereinto. A reflowable oxide layer is formed by coating a reflowable oxide on the anti-oxidation layer while burying the first preliminary contact hole. A silicon oxide layer is formed by thermally treating the reflowable oxide layer. A second preliminary contact hole is formed by anisotropically etching a predetermined portion of the silicon oxide layer, thereby exposing the anti-oxidation layer formed on the bottom surface of the first preliminary contact hole. The exposed anti-oxidation layer is etched so as to form a contact hole for exposing the upper surface of the first conductive patterns. A conductive material is filled in the contact hole, thereby completing a wiring of a semiconductor device.

By forming the anti-oxidation layer, the conductive patterns can be prevented from being oxidized when the silicon oxide layer is formed. In addition, since the silicon oxide layer is formed by thermally treating the reflowable oxide layer, the silicon oxide layer has a superior gap-filling characteristic.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Hereinafter, preferred embodiments of the present invention will be described in detail with reference to accompanying drawings.

FIGS. 2A to 2F are sectional views showing a method for forming a silicon oxide layer in a semiconductor device according to one embodiment of the present invention.

Figure 1A:
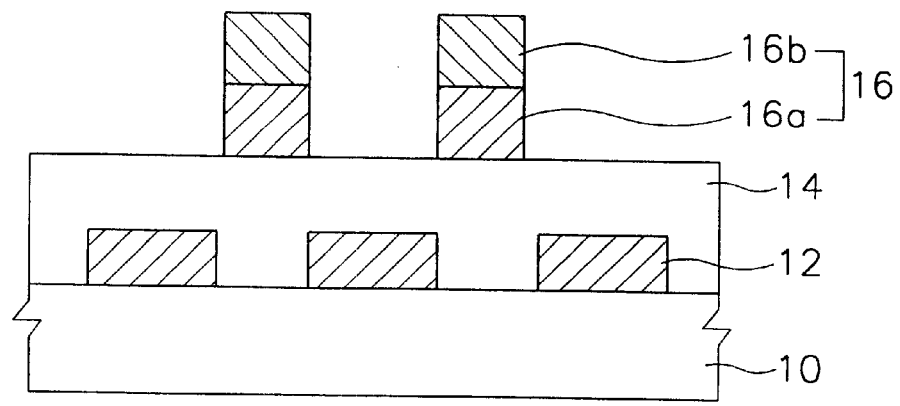
FIGS. 1A to 1D are sectional views showing a conventional method for forming a silicon oxide layer for insulating between fine patterns.
Figure 1B:
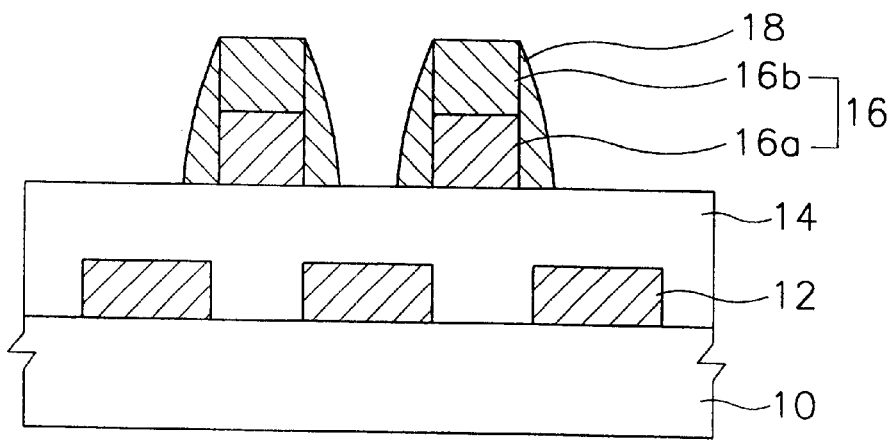
Figure 1C:
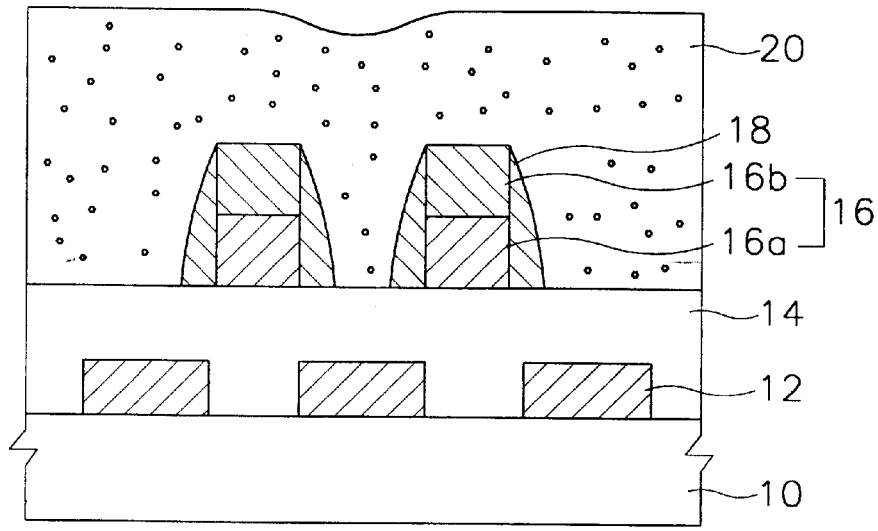
Figure 1D:
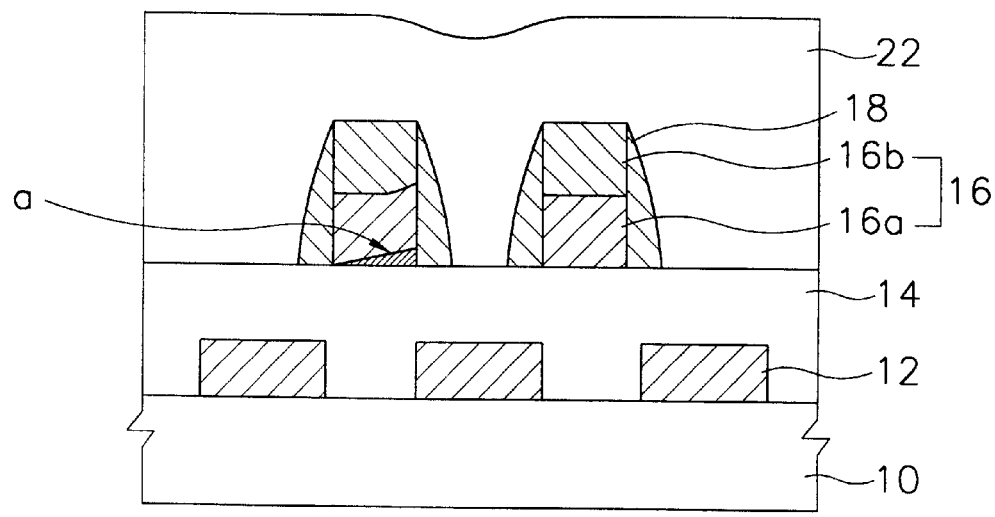
Figure 2A:
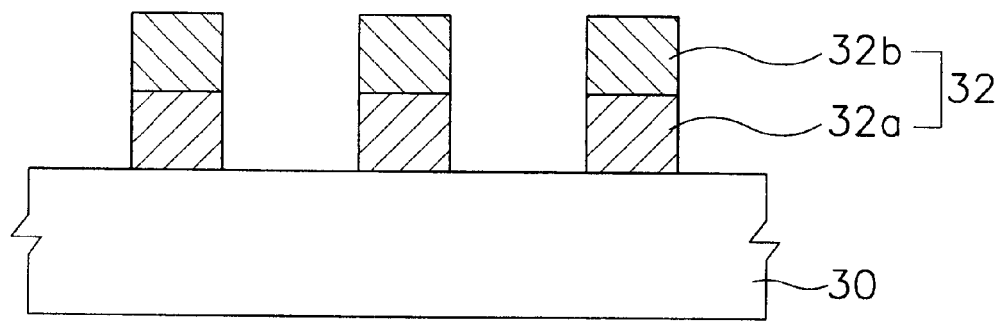
FIGS. 2A to 2F are sectional views showing a method for forming a silicon oxide layer in a semiconductor device according to one embodiment of the present invention.

Referring to FIG. 2A, a plurality of conductive patterns 32 are formed on a semiconductor substrate 30. The conductive pattern 32 is a composite layer pattern including a metal layer pattern 32a and a nitride layer pattern 32b sequentially deposited on the metal layer pattern 32a. The metal layer pattern 32a acts as a conductor.

Particularly, after forming a metal layer on the semiconductor substrate 30 or a semiconductor substrate formed with predetermined layers, a nitride layer is formed through a PE-CVD process. Then, a photoresist pattern is formed on the nitride layer and then the nitride layer is etched using the photoresist pattern as an etching mask. After etching the nitride layer, the metal layer is etched using the nitride layer as a hard mask, thereby forming the conductive patterns 32.

Figure 2B:
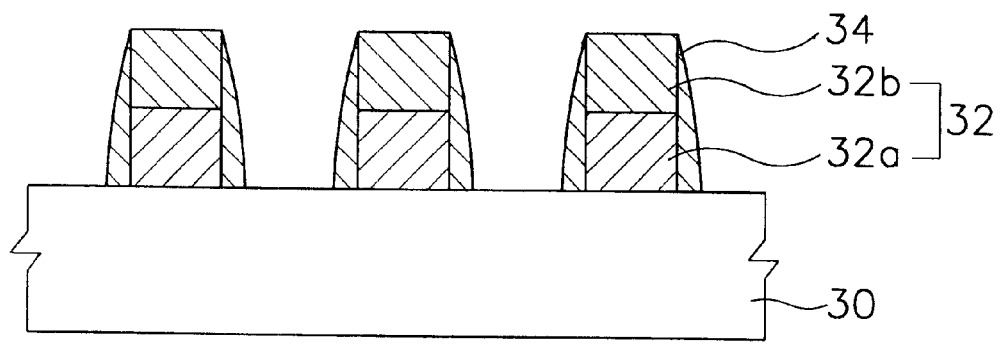

Referring to FIG. 2B, a nitride layer spacer 34 is formed at sidewalls of the conductive patterns 32. The nitride layer spacer 34 is prepared for forming a contact hole between conductive patterns 32 through the subsequent processes.

Particularly, the nitride layer is continuously formed at sidewalls and upper surfaces of the conductive patterns 32 and at an upper surface of the insulating layer. The nitride layer is formed through a low-pressure chemical vapor deposition (LP-CVD) process. Then, the nitride layer is anisotropically etched such that the nitride layer remains only at the sidewalls of the conductive layer pattern, thereby forming the nitride layer spacer 34.

Figure 2C:
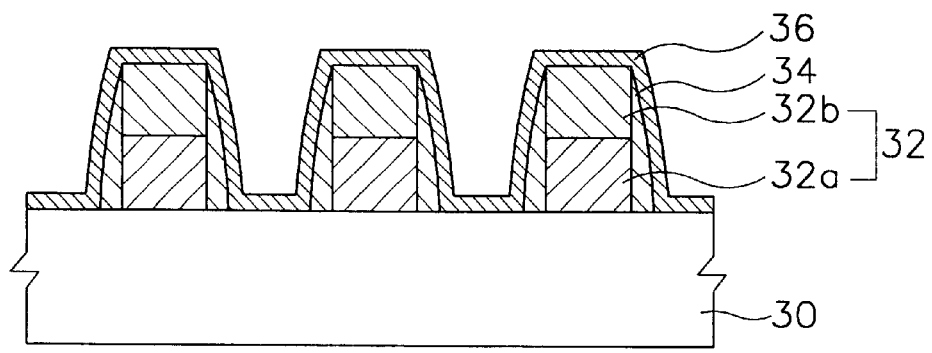

Referring to FIG. 2C, an anti-oxidation layer 36 is sequentially formed on an outer wall of the nitride spacer 34, on the semiconductor substrate 30 and on the upper surfaces of the conductive pattern 32, for preventing an oxidant from penetrating the structure.

The anti-oxidation layer 36 includes a nitride layer having a thickness of 30 to 500 Å. If the thickness of the anti-oxidation layer 36 is too thick, a subsequent process for etching a predetermined portion of the anti-oxidation layer 36 is very difficult. If the thickness of the anti-oxidation layer 36 is too thin, it is difficult to prevent penetration of the oxidant. Accordingly, it is preferred for the anti-oxidation layer 36 have the above thickness. In addition, the anti-oxidation layer 36 is formed through the low-pressure chemical vapor deposition (LP-CVD) process, a plasma-enhanced chemical vapor deposition (PE-CVD) process, or an atmospheric-pressure chemical vapor deposition (AP-CVD) process.

Figure 2D:
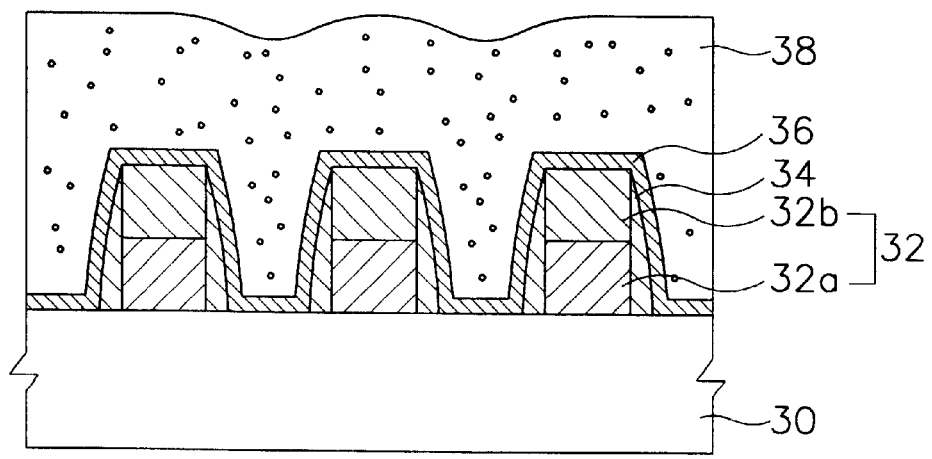

Referring to FIG. 2D, a reflowable oxide layer 38 is formed by coating a reflowable oxide such that spaces between the conductive patterns 32 formed with the nitride layer spacer 34 and the conductive patterns 32 are buried by the reflowable oxide. The reflowable oxide layer 38 includes an SOG layer or a BPSG layer.

The SOG layer can be formed as a planar layer through a simple coating method. In detail, in order to form the SOG layer, an SOG solution is made by dissolving polysiloxane or polysilazane in an organic solvent. Then, the SOG solution is subjected to a spin coating process, so that the SOG layer is formed while burying the conductive patterns and the spaces formed between the conductive patterns.

Figure 2E:
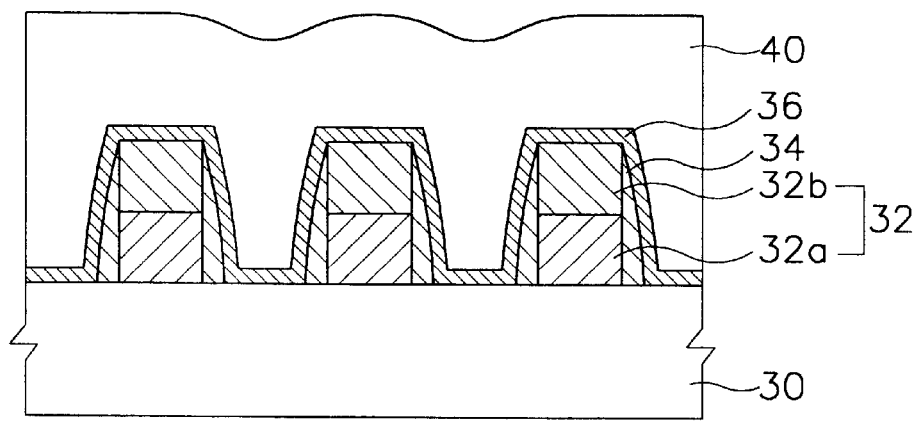

Referring to FIG. 2E, the silicon oxide layer is formed by thermally treating the reflowable oxide layer 38.

In order to thermally treat the SOG layer, the SOG layer is pre-baked at a temperature range of about 50 to 450° C., so that the SOG layer is solidified. Then, a main-baking process is carried out with respect to the SOG layer in an atmosphere including an oxygen gas or a vapor for about 10 to 120 minutes. The main baking process is performed at a temperature range of about 400 to 1000° C. The SOG layer has a base structure of Si—N, Si—H, Si—O, O—H, and N—H bonds. Therefore, when the main baking process for the SOG layer is carried out in an oxygen atmosphere, a vapor atmosphere or a mixed gas atmosphere of oxygen and vapor, Si—N bond or Si—H bond of the SOG layer is replaced with Si—O bond so that a silicon oxide layer 40 is formed. In addition, the silicon oxide layer 40 is densely formed as compared with the SOG layer, so a height of the silicon oxide layer 40 is relatively lowered. Accordingly, a planar silicon oxide layer capable of burying the conductive patterns and the spaces formed between the conductive patterns without creating voids can be achieved.

When the BPSG layer is formed instead of the SOG layer, the BPSG layer is thermally treated in an atmosphere including oxygen gas or vapor for 10 to 120 minutes at a temperature range of about 600 to 900° C.

Oxygen or vapor supplied for thermally treating the SOG layer or the BPSG layer acts as an oxidant, which penetrates into the conductive patterns so as to oxidize the conductive patterns. However, since the anti-oxidation layer 36 is continuously formed at an upper portion of the conductive patterns 32 and at an outer wall of the nitride layer spacer 34, the oxidant is prevented from penetrating into the conductive patterns 32. Therefore, when the thermal treating process is carried out for the SOG layer or the BPSG layer, the conductive patterns 32 can be prevented from being oxidized. Accordingly, process failures, such as a metal lifting, an increase in the resistance thereof, and a crack of the silicon oxide layer caused by the oxidation of the conductive patterns, can be reduced.

Figure 2F:
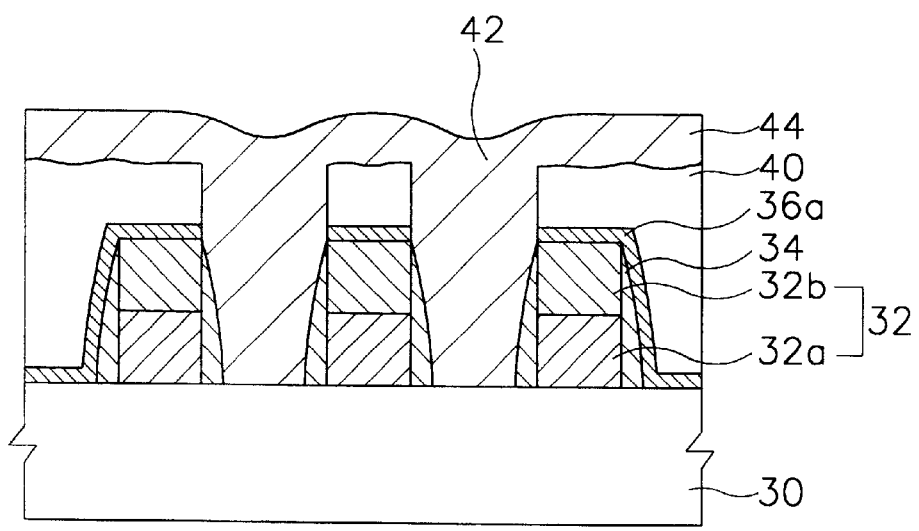

Referring to FIG. 2F, a contact hole 42 for exposing a predetermined portion of the semiconductor substrate 30 is formed by etching the silicon oxide layer filled between conductive patterns 32 and the anti-oxidation layer 36 on the semiconductor substrate 30. Then, conductive materials are filled into the contact hole 42 to form a conductive layer 44, thereby forming the wiring of the semiconductor device.

In detail, a photoresist pattern is formed at a predetermined portion of the silicon oxide layer 40 such that the silicon oxide layer 40 filled between conductive patterns 32 can be etched. Then, the silicon oxide layer 40 is anisotropically etched using the photoresist pattern as an etching mask, thereby exposing the anti-oxidation layer 36 provided at the sidewalls of the conductive patterns 32 and the upper portion of the semiconductor substrate 30. Since the anti-oxidation layer 36 including the nitride layer is rarely etched, only can the silicon oxide layer 40 filled between the conductive patterns 32 be etched through the above process.

That is, the contact hole making contact with the semiconductor substrate 30 is formed by anisotropically etching the anti-oxidation layer 36 formed on the semiconductor substrate. As shown in FIG. 2F, when the etching process is carried out, an anti-oxidation layer 36a formed at a sidewall of the nitride spacer 34 is partially etched. The etching processes for the silicon oxide layer 40 and the anti-oxidation layer are carried out in-situ.

Therefore, the planar silicon oxide layer can be achieved without creating voids between conductive patterns having fine intervals therebetween. In addition, when the silicon oxide layer is formed, the metal layer pattern acting as a conductor in the conductive patterns can be prevented from being oxidized.

FIGS. 3A to 3I are sectional views showing a method for forming a wiring having the silicon oxide layer capable of insulating between fine patterns in a DRAM device according to one embodiment of the present invention.

Figure 3A:
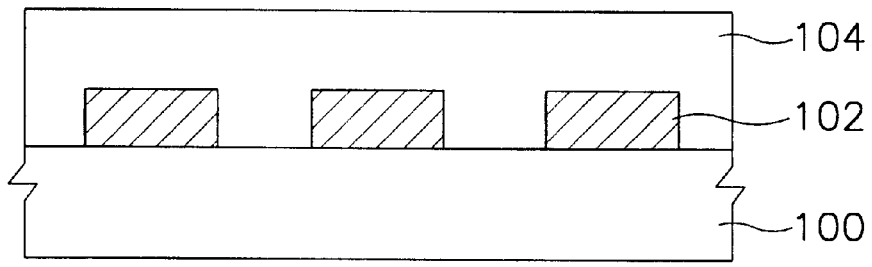
FIGS. 3A and 3I are sectional views showing a method for forming a wiring having a silicon oxide layer for insulating between fine patterns in a DRAM device according to one embodiment of the present invention.

Referring to FIG. 3A, transistors having a gate and a capacitor contact area are formed on a semiconductor substrate 100. An insulating layer 104 having a plurality of conductive patterns 102 therein, which make contact with the capacitor contact area, is formed on the semiconductor substrate 104.

Particularly, the semiconductor substrate is divided into an active area and a field area through an isolating process, such a LOCOS (LOCal Oxidation of Silicon) process. Then, the transistor is formed at the active area of the semiconductor substrate. That is, after growing a shallow gate oxide layer on a surface of the active area through a thermal oxidation process, the gate (not shown) of the transistor provided as a word line is formed on the shallow gate oxide layer. Preferably, the gate is formed as a polycide structure including a polysilicon layer doped with a high-density impurity through a conventional doping process, such as a diffusing process, an ion implantation process, or an in-situ doping process and a tungsten silicide layer stacked on the polysilicon layer. In addition, source/drain areas of the transistor are formed at surface portions of the active area by implanting impurities using a gate as a mask. One of the doping areas is the capacitor contact area, which makes contact with a storage electrode of the capacitor and the other is a bit line contact area which makes contact with a bit line. Then, after depositing an insulating layer on the transistors and the semiconductor substrate, the insulating layer is etched, thereby exposing the source/drain area.

Then, doped polysilicon is deposited on the entire surface of the resulted structure and then the deposited polysilicon is patterned, so as to form conductive patterns 102 which make contact with the source/drain areas.

A BPSG (borophosphosilicate glass) or a USG (undoped silicate glass) having superior planar characteristic is deposited on the conductive patterns 102 and the semiconductor substrate to form the insulating layer 104. Then, the insulating layer 104 is planarized through a reflow process, an etch back process, or a chemical and mechanical polishing process.

Figure 3B:
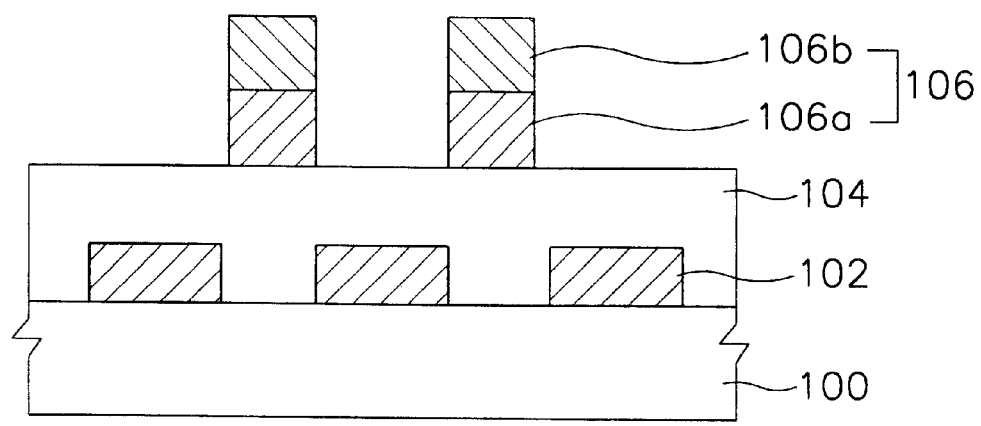

Referring to FIG. 3B, a metal layer formed by depositing a metal material and a silicon nitride layer are sequentially formed on the resulting structure. Then, bit line structures 106 are formed by patterning the silicon nitride layer and the metal layer.

Particularly, after forming a barrier metal layer, such as a titanium (Ti) layer or a titanium nitride (TiN) layer, a metal layer, such as tungsten, is deposited to a thickness of about 1000 to 1200 Å. Then, a nitride layer is deposited thereon to a thickness about 1800 to 2000 Å. The nitride layer is formed through a CVD process at a temperature range of about 400 to 600° C. Thereafter, a photolithography process is carried out so as to change the nitride layer into a nitride layer pattern 106b. In addition, the metal layer is patterned by using the nitride layer pattern 106b as a hard mask, thereby forming the bit line structure 106 including a bit line 106a and the nitride layer pattern 106b. At this time, the bit line structures 106 are positioned in a line pattern at upper portions of spaces formed between conductive patterns 102.

Figure 3C:
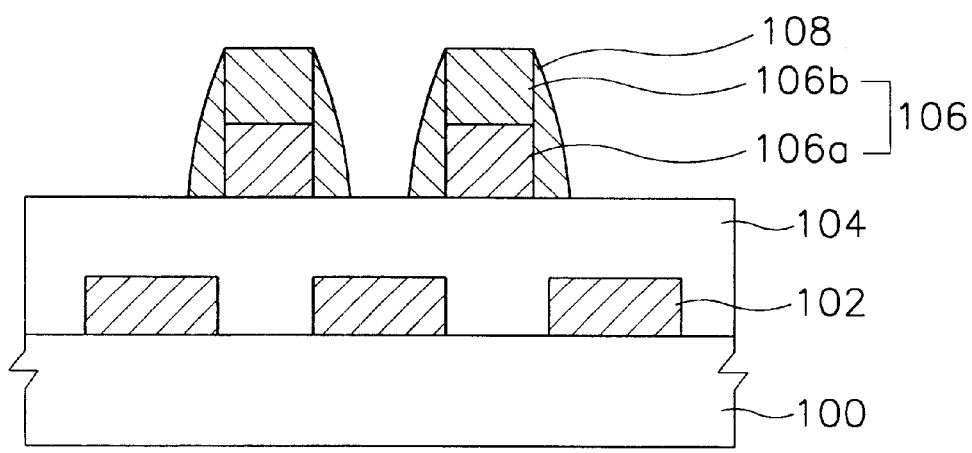

Referring to FIG. 3C, nitride layer spacers 108 are formed at sidewalls of the bit line structure 106. The nitride layer spacers 108 are prepared for forming a self-aligned contact hole, which communicates with lower conductive patterns 102, in following processes.

Particularly, the nitride layer is continuously formed at the sidewalls and upper surface of the bit line structure 106 and the upper surface of the insulating layer. The nitride layer is formed through a low-pressure chemical vapor deposition (LP-CVD) process. In addition, the nitride layer is anisotropically etched such that the nitride layer remains only at the sidewalls of the bit line structure 106, thereby forming the nitride spacers 108.

Figure 3D:
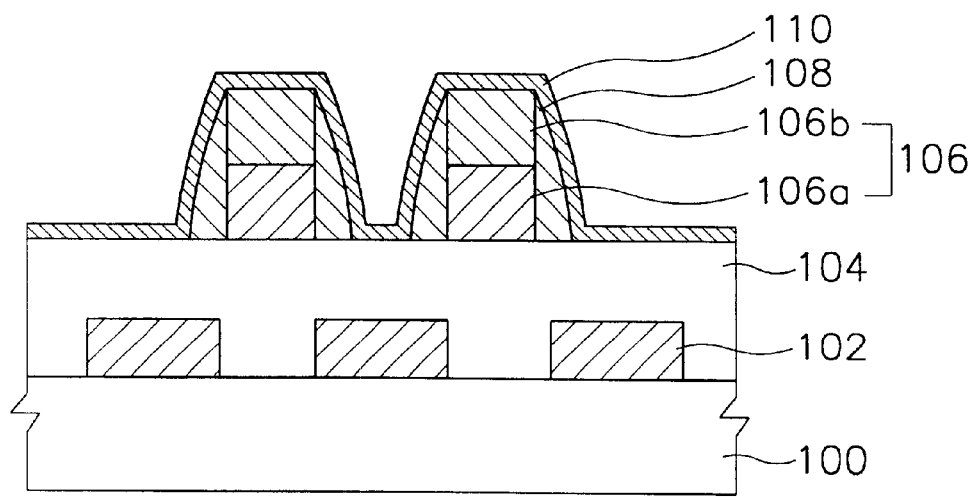

Referring to FIG. 3D, an anti-oxidation layer 110 for preventing the penetration of the oxidant is sequentially formed on the upper surface of the bit line structure 106, outer walls of the nitride layer spacers 108, and the upper surface of the insulating layer 104. The anti-oxidation layer 110 is prepared for preventing the bit line 106a from being oxidized while following processes are being carried out.

In detail, the anti-oxidation layer is formed by sequentially depositing the nitride layer on the upper surface of the bit line structure 106, the outer walls of the nitride layer spacers 108 and the upper surface of the insulating layer. The anti-oxidation layer 110 has a thickness of about 30 to 500 Å. At this time, the anti-oxidation layer 110 is deposited through a low-pressure chemical vapor deposition (LP-CVD) process, a plasma-enhanced chemical vapor deposition (PE-CVD) process, or an atmospheric-pressure chemical vapor deposition process (AP-CVD).

Figure 3E:
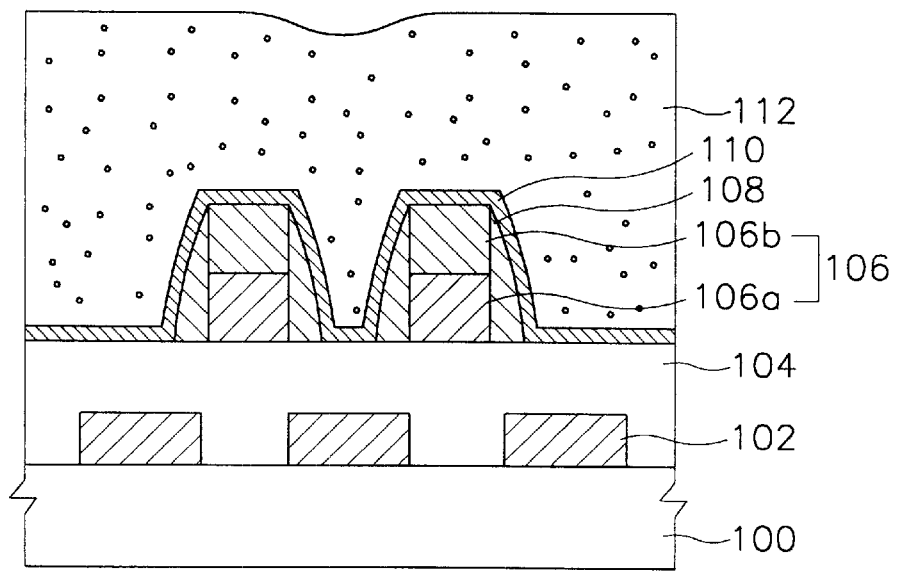

Referring to FIG. 3E, a reflowable oxide layer 112 is formed by coating reflowable oxide materials on the anti-oxidation layer 110 while burying the bit line structure 106 formed with the anti-oxidation layer 110. The reflowable oxide layer 112 includes an SOG layer or a BPSG layer.

The SOG layer is, as mentioned above, formed through a spin coating process, so a uniform layer is achieved without creating voids even when the bit line structures 106 have a narrow interval therebetween. In addition, the BPSG layer has superior gap fill characteristic, so it is possible to uniformly form the BPSG layer.

Figure 3F:
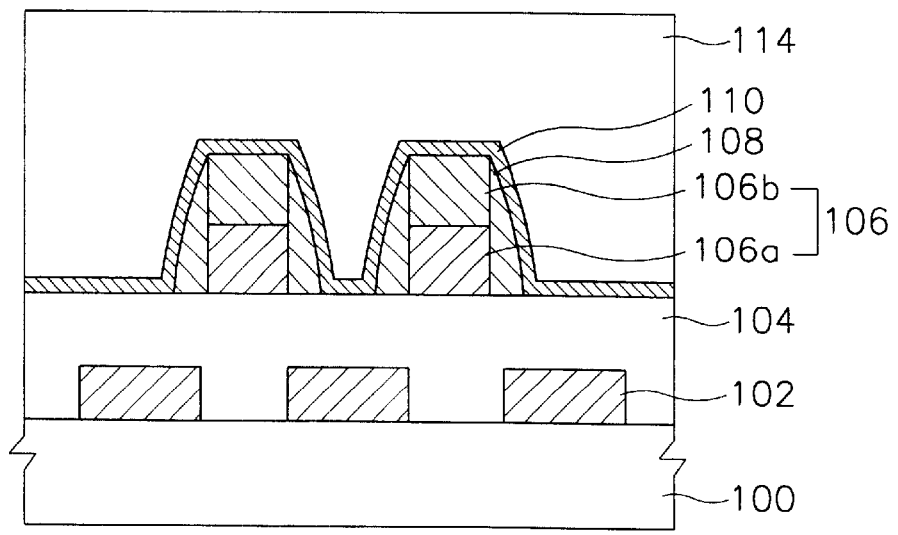

Referring to FIG. 3F, a silicon oxide layer 114 is formed by thermally treating the reflowable oxide layer 112.

In detail, in order to thermally treat the SOG layer, the SOG layer is pre-baked at a temperature range of about 50 to 450° C., so that the SOG layer is solidified. Then, a main-baking process is carried out with respect to the SOG layer in an oxygen atmosphere, a vapor atmosphere, or a mixed gas atmosphere of oxygen and vapor for about 10 to 120 minutes at a temperature range of about 400 to 1000° C. When the main baking process has been carried out, the Si—N bond or Si—H bond of the SOG layer is replaced with Si—O bond so that the silicon oxide layer 114 is formed. In addition, the silicon oxide layer 114 formed by thermally treating the SOG layer has similar characteristics (for example, etching rate . . . ) to the silicon oxide layer formed through the CVD process.

When the BPSG layer is used instead of the SOG layer, the BPSG layer is thermally treated in an atmosphere including oxygen gas or vapor for about 10 to 120 minutes with a temperature range of about 600 to 900° C. By the thermal treating process, the BPSG layer is converted into a planar silicon oxide layer 114.

As mentioned above, since the anti-oxidation layer 110 is sequentially formed on the upper surface of the bit line structure 106 and the outer wall of the nitride layer spacer 108, oxygen or vapor used for thermally treating the reflowable oxide layer 112 is prevented from penetrating into the bit line 106a. Therefore, a process failure, such as a lifting of the bit line 106a, an increase of resistance, and a crack of the silicon oxide layer 114, can be reduced.

After forming the silicon oxide layer through the above-mentioned processes, a planarization process for planarizing the silicon oxide layer 114 is further carried out. The planar process can be carried out after the pre-baking process of the SOG layer, or after the main-baking process of the SOG layer. The planarization process includes a chemical mechanical polishing process or an etch back process. When the planarization process is carried out, a thickness of the silicon oxide layer 114 is reduced. Accordingly, the silicon oxide layer 114 has to be formed by considering the thickness to be reduced.

Figure 3G:
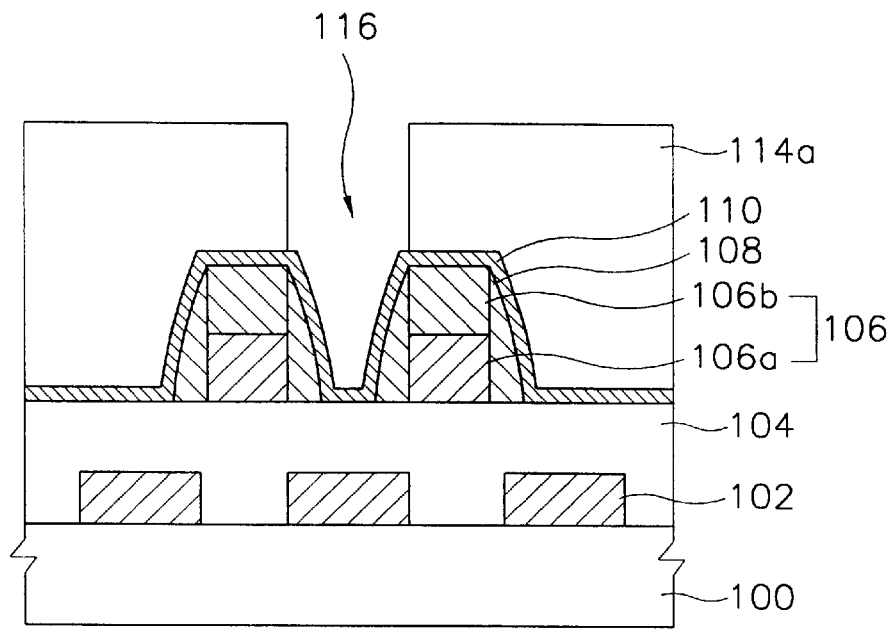

Referring to FIG. 3G, a preliminary contact hole 116 for exposing the anti-oxidation layer 110 formed on the sidewall of the bit line structure 106 and the upper surface of the insulating layer is formed by anisotropically etching a predetermined portion of a silicon oxide layer 114a.

In detail, a photoresist pattern is formed on the silicon oxide layer 114a such that an upper portion thereof corresponding to a space formed between bit line structures 106 is opened. Then, the silicon oxide layer 114a is anisotropically etched using the photoresist pattern as an etching mask. When the silicon oxide layer 114a is etched, the anti-oxidation layer 110 including the nitride layer is rarely etched, so the preliminary contact hole 116, through which the anti-oxidation layer 110 formed on the sidewall of the bit line structure 106 and the upper surface of the insulating layer are exposed, is formed.

Figure 3H:
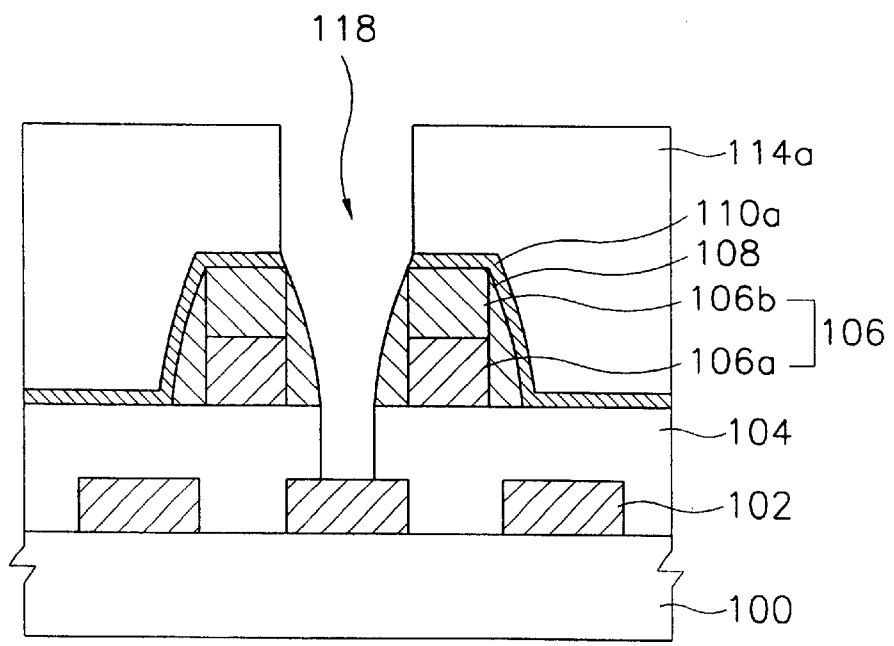
Figure 31:
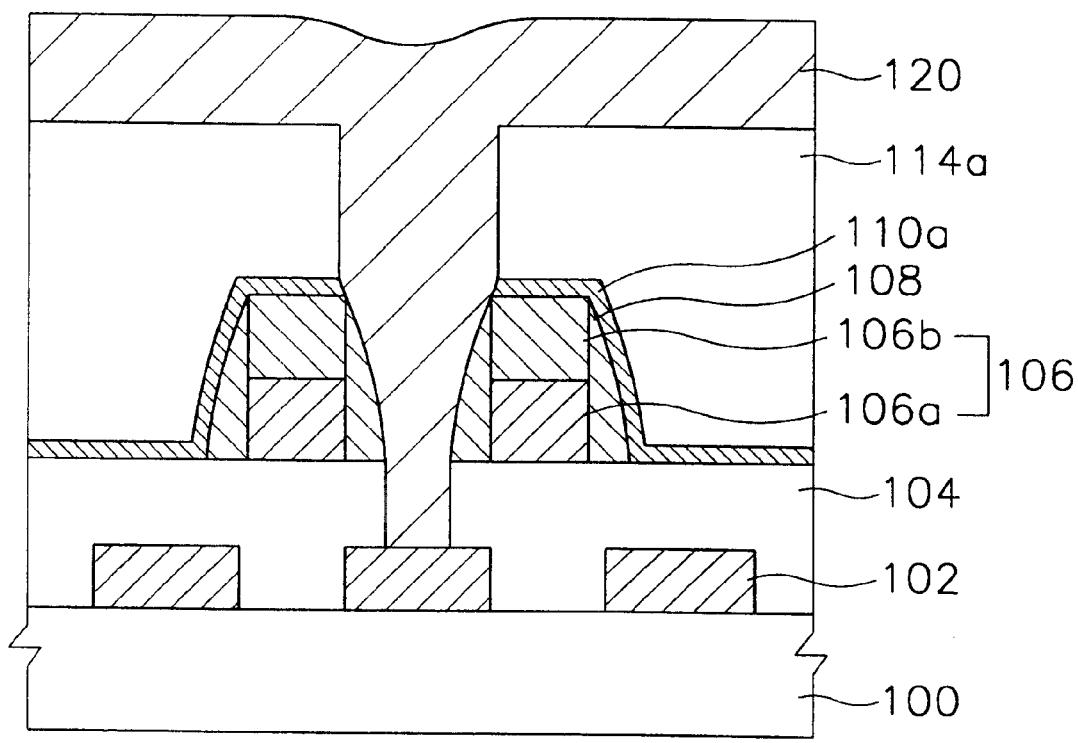

Referring to FIG. 3H, after anisotropically etching the anti-oxidation layer 110 exposed to a bottom surface of the preliminary contact hole, the insulating layer 104 is anisotropically etched, in sequence, thereby forming a contact hole 118 for exposing an upper surface of the conductive patterns. As shown in the figure, when the anti-oxidation layer 110 is anisotropically etched, an anti-oxidation layer 110a formed at the sidewall of the nitride layer spacer 34 is partially etched.

In one embodiment, the process for forming the preliminary contact hole by etching the silicon oxide layer 114, which is described with reference to FIG. 3G, and the process for forming the contact hole 118 by etching the anti-oxidation layer 110 and the insulating layer 104 are carried out in-situ.

Referring to FIG. 3I, a conductive layer 120 is formed by filling conductive materials in the contact hole 118. Therefore, a wiring communicated with the conductive patterns 102 can be formed in a DRAM device without generating a short with respect to the bit line 106a of the bit line structure 106.

FIGS. 4A to 4I are sectional views showing a method for forming a wiring having a silicon oxide layer capable of insulating between fine patterns in a DRAM device according to another embodiment of the present invention.

Figure 4A:
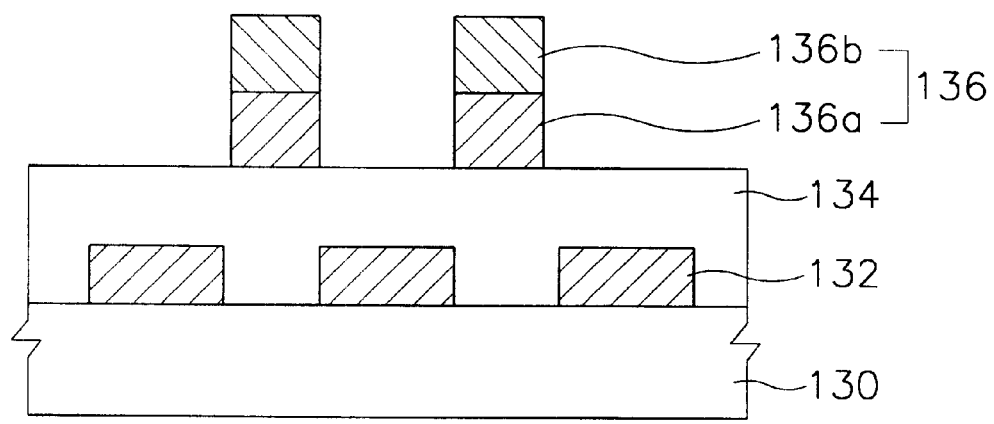
FIGS. 4A and 4I are sectional views showing a method for forming a wiring having a silicon oxide layer for insulating between fine patterns in a DRAM device according to another embodiment of the present invention.

Referring to FIG. 4A, an insulating layer 134 including a plurality of conductive patterns 132 therein, which make contact with a capacitor contact area, is formed by performing processes described with reference to FIGS. 3A and 3B. Then, bit line structures 136 are formed as a line pattern on positions corresponding to upper portions of the spaces formed between the conductive patterns 132. The bit line structure 136 is a composite layer pattern including a bit line 136a of a metal layer pattern and a nitride layer pattern 136b sequentially stacked on the bit line 136a. In addition, the nitride layer pattern 136b of the bit line structure 136 is formed by patterning a nitride layer after depositing the nitride layer through a PE-CVD process.

Figure 4B:
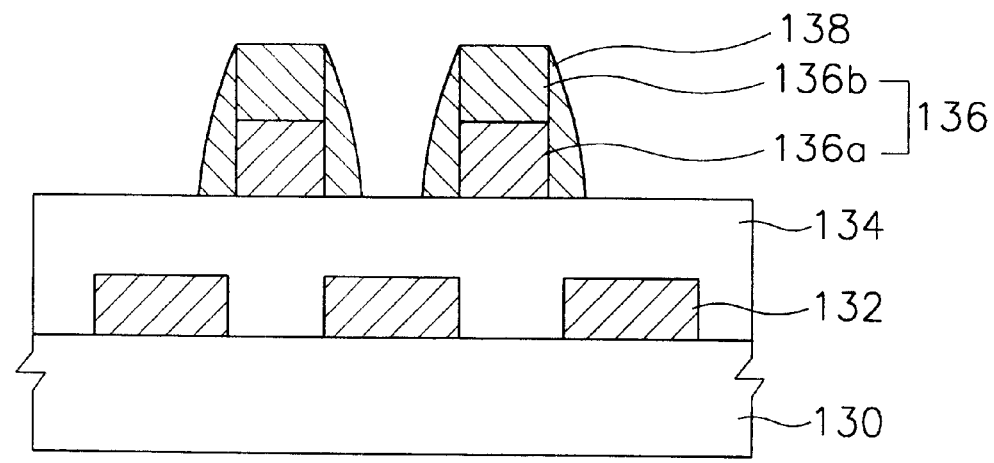

Referring to FIG. 4B, nitride layer spacers 138 are formed at sidewalls of the bit line structure 136. The nitride layer spacer 138 is prepared to form a self-aligned contact hole, which communicates with lower conductive patterns 132, in subsequent processes.

Particularly, the nitride layer is continuously formed at the sidewall and upper surface of the bit line structure 136 and the upper surface of the insulating layer. The nitride layer is formed through a low-pressure chemical vapor deposition (LP-CVD) process. Particularly, the nitride layer is anisotropically etched such that the nitride layer remains only at the sidewalls of the bit line structure 136, thereby forming the nitride spacers 138.

Figure 4C:
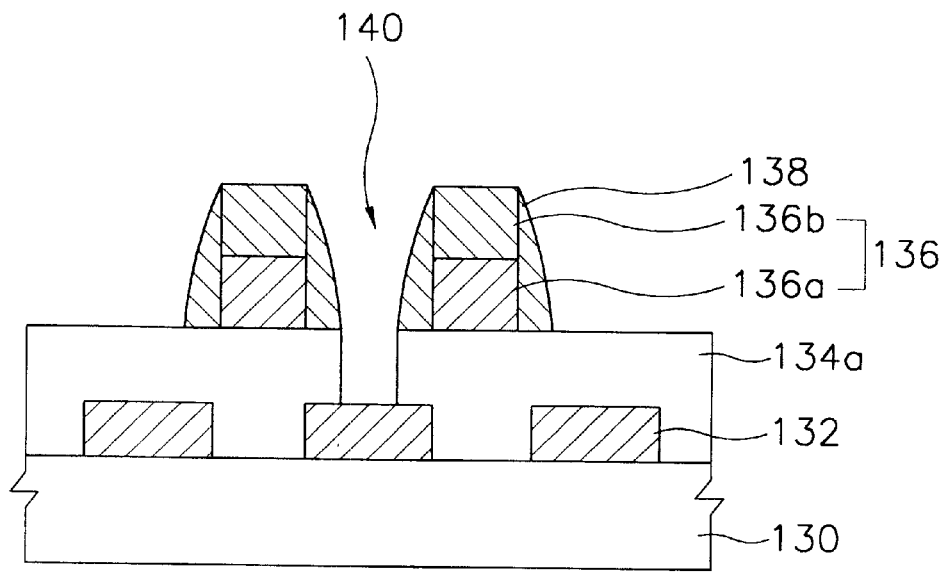

Referring to FIG. 4C, a first preliminary contact hole 140 for exposing an upper surface of the conductive patterns 132 is formed by anisotropically etching a lower insulating layer 134a using the nitride layer spacer 138 of the bit line structure 136 as an etching mask. When the lower insulating layer 134a is anisotropically etched, the exposed nitride layer spacer 138 is rarely etched, so the first preliminary contact hole 140 is formed so as to have an etched portion of the insulating layer 134a positioned between the bit line structures 138.

Figure 4D:
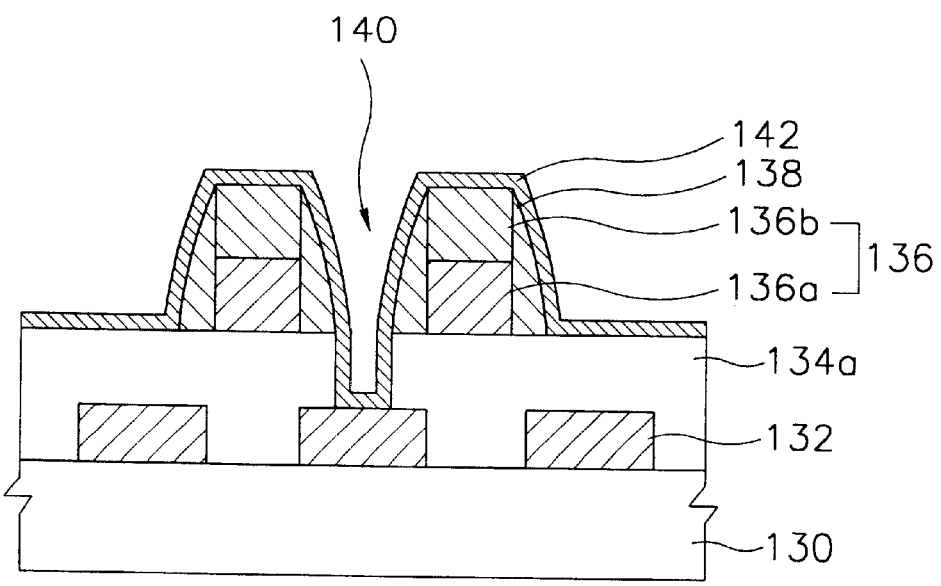

Referring to FIG. 4D, an anti-oxidation layer 142 is sequentially formed on a sidewall and a bottom of the first preliminary contact hole 140 and on an upper portion of the bit line structure 136 so as to prevent an oxidant from penetrating into the first preliminary contact hole and the bit line structure 136. The anti-oxidation layer 142 is prepared for preventing a bit line 136a from being oxidized while following processes are being carried out.

The anti-oxidation layer 142 has a thickness of about 30 to 500 Å. At this time, the anti-oxidation layer 142 is deposited through the low-pressure chemical vapor deposition (LP-CVD) process, a plasma-enhanced chemical vapor deposition (PE-CVD) process, or an atmospheric-pressure chemical vapor deposition (AP-CVD) process.

Figure 4E:
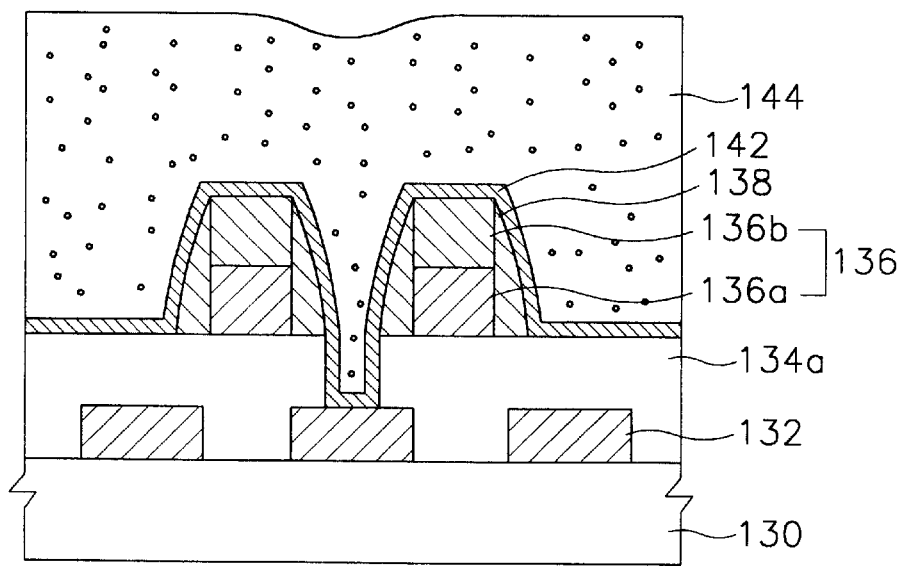

Referring to FIG. 4E, a reflowable oxide layer 144 is formed while burying the first preliminary contact hole 140 formed with the anti-oxidation layer 142 and the bit line structures 136. The reflowable oxide layer 144 includes an SOG layer or a BPSG layer.

Figure 4F:
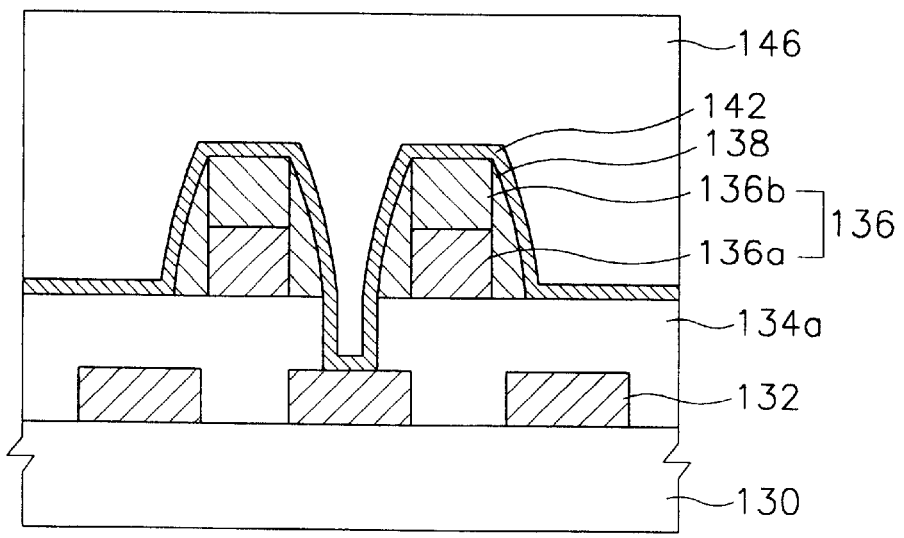

Referring to FIG. 4F, a silicon oxide layer 146 is formed by thermally treating the reflowable oxide layer 144.

Particularly, the SOG layer can be formed as a planar layer through a coating method. In detail, the SOG layer is pre-baked at a temperature range of about 50 to 450° C., so that the SOG layer is solidified. Then, a main-baking process is carried out with respect to the SOG layer in an oxygen atmosphere, a vapor atmosphere or a mixed gas atmosphere of oxygen gas and vapor for 10 to 120 minutes at a temperature range of about 400 to 1000° C. By performing the main baking process, the SOG layer is converted into the silicon oxide layer 146.

When the BPSG layer is formed instead of the SOG layer, the BPSG layer is thermally treated in an atmosphere including oxygen gas or vapor for about 10 to 120 minutes at a temperature range of about 600 to 900° C.

Since the anti-oxidation layer 142 is formed on the bit line structure 136, oxygen supplied to thermally treat the reflowable oxide layer 144 cannot penetrate into the bit line 136a. Therefore, process failures, such as a lifting of the bit line, an increase in a resistance thereof, and a crack of the silicon oxide layer, can be reduced.

After forming the silicon oxide layer 146, a planar process for planarizing the silicon oxide layer 146 is further carried out. At this time, the planarization process can be carried out after the pre-baking process of the SOG layer, or after the main-baking process of the SOG layer. The planarization process includes a chemical mechanical polishing process or an etch back process. When the planarization process is carried out, a thickness of the silicon oxide layer 146 is reduced. Accordingly, the silicon oxide layer 146 is preferably formed while considering the thickness to be reduced.

Figure 4G:
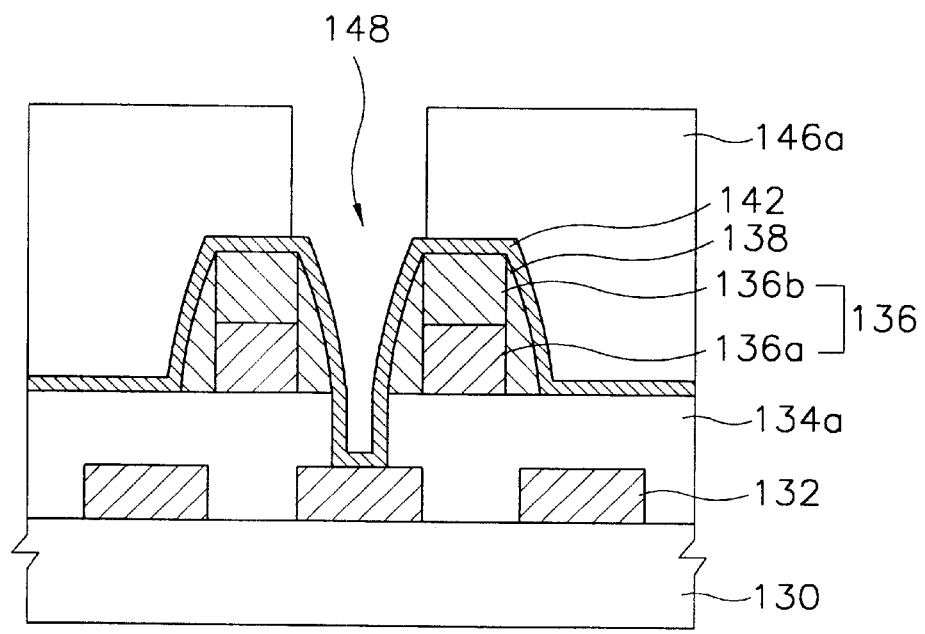

Referring to FIG. 4G, a second preliminary contact hole 148 for exposing the anti-oxidation layer 142 formed on the sidewall of the nitride layer spacer 138 and the upper surface of the conductive patterns 132 is formed by anisotropically etching a predetermined portion of a silicon oxide layer 146a.

Particularly, a photoresist pattern is formed on the silicon oxide layer 114a such that an upper portion thereof corresponding to a space formed between bit line structures 136 is opened. Then, the silicon oxide layer 146a is anisotropically etched using the photoresist pattern as an etching mask. When the silicon oxide layer 146a is etched, the anti-oxidation layer 142 including the nitride layer is rarely etched, so the second preliminary contact hole 148, through which the anti-oxidation layer 110 formed on the sidewall of the bit line structure 106 and the upper surface of the insulating layer are exposed, is formed.

Figure 4H:
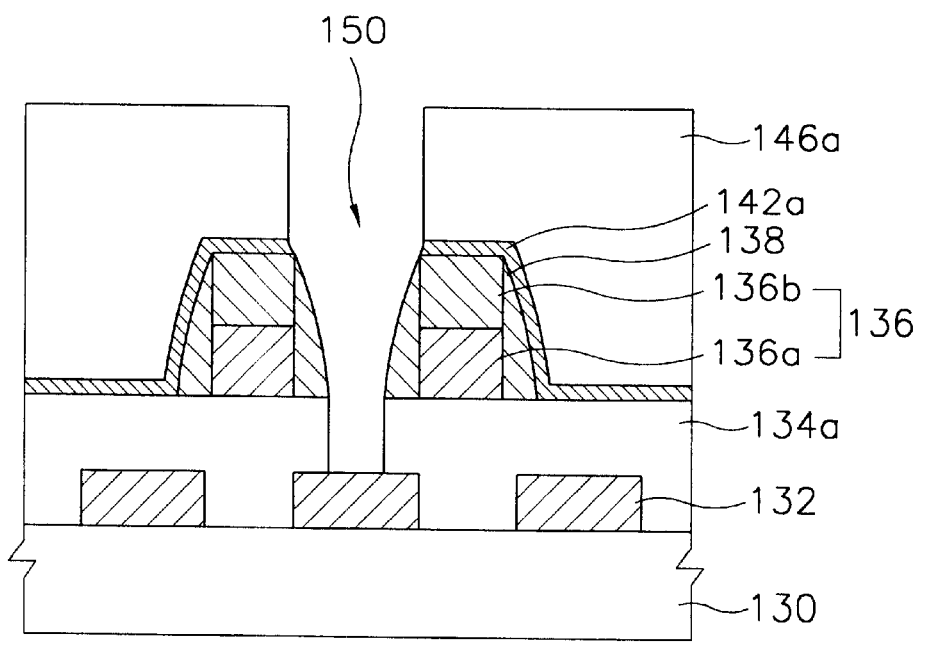

Referring to FIG. 4H, a contact hole 150 is formed by anisotropically etching the anti-oxidation layer 148 exposed to a bottom surface of the second preliminary contact hole 148.

In one embodiment, the process for forming the second preliminary contact hole 148 by etching the silicon oxide layer 146a, which is described with reference to FIG. 4G, and the process for forming the contact hole 150 by etching the anti-oxidation layer 142 are carried out in-situ.

As described above, since the first preliminary contact hole 140 for exposing the conductive patterns 132 is formed in advance, the contact hole 150 can be formed through two etching steps, that is, the contact hole 150 can be formed by etching the silicon oxide layer 146a and the anti-oxidation layer 142. In addition, it is not required to etch the insulating layer after etching the anti-oxidation layer, so the process is simplified. In addition, even when the insulating layer is etched in a state that the anti-oxidation layer is not completely etched, the etching process for the insulating layer is not interrupted by the remaining anti-oxidation layer, so that the process failure is prevented.

Figure 4I:
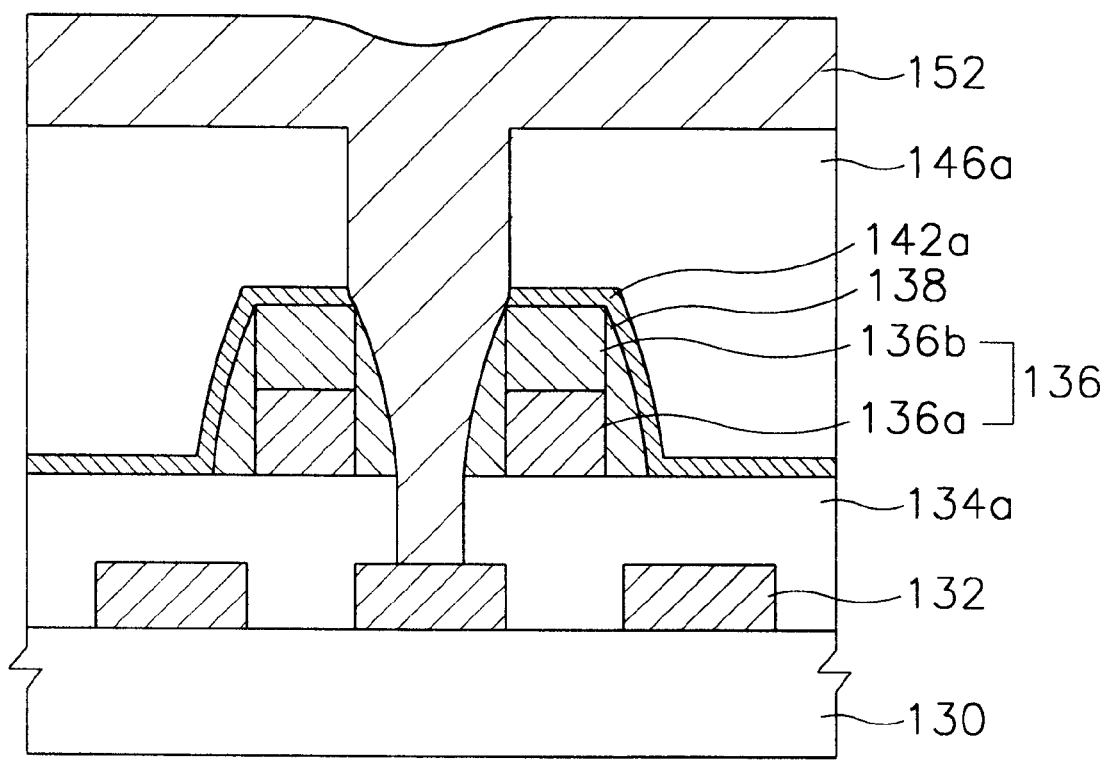

Referring to FIG. 4I, a conductive layer 152 is formed by filling conductive materials into the contact hole 150. Therefore, a wiring communicated with the conductive patterns 132 can be achieved without generating a short with respect to the bit line 136a of the bit line structure 136.

According to the method for forming the wiring in the DRAM device of the present invention, the planar silicon oxide layer can be formed without forming voids between bit line structures having fine intervals therebetween. In addition, when the wiring of the DRAM device is formed, the bit line can be prevented from being oxidized.

As mentioned above, according to the present invention, a silicon oxide layer capable of insulating between patterns positioned with fine intervals can be formed without forming voids. In addition, the patterns having fine intervals therebetween are prevented from being oxidized when the silicon oxide layer is formed.

While the present invention has been described in detail with reference to the preferred embodiments thereof, it should be understood to those skilled in the art that various changes, substitutions and alterations can be made hereto without departing from the scope of the invention as defined by the appended claims.

What is claimed is:

1. A method for forming an insulating layer in a semiconductor device, the method comprising the steps of:
   i) forming a plurality of conductive patterns on a semiconductor substrate;
   ii) sequentially forming an anti-oxidation layer on the conductive patterns and on the semiconductor substrate for preventing an oxidant from penetrating into the conductive patterns and the semiconductor substrate;
   iii) forming a reflowable oxide layer by coating a reflowable oxide material on the conductive patterns having the anti-oxidation layer formed thereon while burying the conductive patterns; and
   iv) forming a silicon oxide layer by thermally treating the reflowable oxide layer.

2. The method as claimed in claim 1, wherein the anti-oxidation layer includes a nitride layer.

3. The method as claimed in claim 1, wherein the anti-oxidation layer has a thickness of about 30 to 500 Å.

4. The method as claimed in claim 1, wherein the anti-oxidation layer is formed through one of a low-pressure chemical vapor deposition process, a plasma enhanced chemical vapor deposition process, and an atmospheric-pressure chemical vapor deposition process.

5. The method as claimed in claim 1, wherein the reflowable oxide layer is at least one of an SOG layer and a BPSG layer.

6. The method as claimed in claim 5, wherein the SOG layer is thermally treated by a) pre-baking the SOG layer at a temperature range of about 40 to 450° C.; and b) performing a main baking process on the SOG layer at a temperature range of about 400 to 1000° C.

7. The method as claimed in claim 6, wherein step b) is carried out for about 10 to 120 minutes in one of an oxygen atmosphere, a vapor atmosphere and a mixed gas atmosphere of oxygen and vapor.

8. The method as claimed in claim 5, wherein the BPSG layer is thermally treated for about 10 to 120 minutes in an atmosphere including one of oxygen and vapor while maintaining a temperature in a range of about 600 to 900° C.

9. The method as claimed in claim 1, wherein the conductive pattern includes a composite layer pattern having a metal layer pattern and a nitride layer pattern sequentially deposited on the metal layer pattern.

10. The method as claimed in claim 9, wherein the nitride layer pattern is formed by patterning a nitride layer which is deposited through a PE-CVD process.

11. The method as claimed in claim 1, further comprising the step of, after forming the silicon oxide layer, forming a contact hole for partially exposing the semiconductor substrate between the conductive patterns by using the conductive patterns as an aligning mask.

12. The method as claimed in claim 11, wherein the contact hole is formed by etching a predetermined portion of the silicon oxide layer to expose sidewalls of the conductive layer patterns between conductive layer patterns and the anti-oxidation layer formed on the semiconductor substrate and anisotropically etching the anti-oxidation layer on the semiconductor substrate to expose the semiconductor substrate.

13. The method as claimed in claim 12, wherein the etching process for the silicon oxide layer and the anti-oxidation layer is carried out in-situ.

14. The method as claimed in claim 1, further comprising the step of forming a nitride layer spacer at sidewalls of the conductive patterns before the anti-oxidation layer is formed.

15. A method for forming a wiring in a semiconductor device, the method comprising the steps of;
   i) forming an insulating layer including a plurality of first conductive patterns therein on a semiconductor substrate;
   ii) forming second conductive patterns on the insulating layer corresponding to upper portions of spaces formed between first conductive patterns;
   iii) sequentially forming an anti-oxidation layer on upper surfaces of the second conductive patterns and the insulating layer for preventing an oxidant from penetrating into the second conductive patterns and the insulating layer;
   iv) forming a reflowable oxide layer by coating a reflowable oxide material on the anti-oxidation layer while burying the second conductive patterns;
   v) forming a silicon oxide layer by thermally treating the reflowable oxide layer;
   vi) forming a preliminary contact hole for exposing the anti-oxidation layer formed on the insulating layer by anisotropically etching a predetermined portion of the silicon oxide layer;
   vii) anisotropically etching the anti-oxidation layer exposed to the upper surface of the insulating layer and the insulating layer, in sequence, thereby forming a contact hole for exposing an upper surface of the first conductive patterns; and
   viii) filling conductive materials in the contact hole.

16. The method as claimed in claim 15, wherein the anti-oxidation layer is a nitride layer.

17. The method as claimed in claim 15, wherein the reflowable oxide layer is at least one of an SOG layer and a BPSG layer.

18. The method as claimed in claim 17, wherein the SOG layer is thermally treated by a) pre-baking the SOG layer at a temperature range of about 40 to 450° C.; and b) performing a main baking process on the SOG layer at a temperature range of about 400 to 1000° C.

19. The method as claimed in claim 17, wherein the BPSG layer is thermally treated for about 10 to 120 minutes in an atmosphere including one of oxygen and vapor while maintaining a temperature at a range of about 600 to 900° C.

20. The method as claimed in claim 15, wherein, after forming the silicon oxide layer, one of a chemical mechanical polishing process and an etch back process is carried out for planarizing the silicon oxide layer.

21. The method as claimed in claim 15, wherein step vi) and step vii) are carried out in-situ.

22. A method for forming a wiring in a semiconductor device, the method comprising the steps of;
- i) forming an insulating layer including a plurality of first conductive patterns therein on a semiconductor substrate;
- ii) forming second conductive patterns on the insulating layer corresponding to upper portions of spaces formed between first conductive patterns;
- iii) forming a nitride layer spacer at sidewalls of the second conductive patterns;
- iv) forming a first preliminary contact hole for exposing an upper surface of the first conductive patterns by performing an anisotropic etching process using the nitride layer spacer as an etching mask;
- v) sequentially forming an anti-oxidation layer on an upper surface of the second conductive pattern, an upper surface of the insulating layer, and a sidewall and a bottom surface of the first preliminary contact hole, for preventing an oxidant from penetrating thereto;
- vi) forming a reflowable oxide layer by coating a reflowable oxide material on the anti-oxidation layer while burying the first preliminary contact hole;
- vii) forming a silicon oxide layer by thermally treating the reflowable oxide layer;
- viii) forming a second preliminary contact hole by anisotropically etching a predetermined portion of the silicon oxide layer, thereby exposing the anti-oxidation layer formed on the bottom surface of the first preliminary contact hole;
- ix) etching the exposed anti-oxidation layer, thereby forming a contact hole for exposing the upper surface of the first conductive patterns; and
- x) filling conductive materials in the contact hole.

23. The method as claimed in claim 22, wherein the anti-oxidation layer includes a nitride layer.

24. The method as claimed in claim 22, wherein the reflowable oxide layer is at least one of an SOG layer and a BPSG layer.

25. The method as claimed in claim 22, wherein, after forming the silicon oxide layer, at least one of a chemical mechanical polishing process and an etch back process is carried out for planarizing the silicon oxide layer.

26. The method as claimed in claim 22, wherein steps viii) and ix) are carried out in-situ.

* * * * *